Nov. 2, 1954 M. J. PIFER 2,693,584

ELECTRICAL COMPONENT ASSEMBLY

Filed Aug. 18, 1953

INVENTOR.
Marian J. Pifer
BY John A. Harvey
ATTORNEY

United States Patent Office 2,693,584

Patented Nov. 2, 1954

2,693,584

ELECTRICAL COMPONENT ASSEMBLY

Marion J. Pifer, Williamsville, N. Y., assignor to Sylvania Electric Products Inc., a corporation of Massachusetts Application August 18, 1953, Serial No. 374,855

4 Claims. (Cl. 339—17)

This invention relates to electrical component assemblies. More particularly it relates to compact assembly of circuit components adapted to be associated with detachable miniature and subminiature electron tubes and the like.

Heretofore, a major problem in printed circuit design has been the difficulty of securing satisfactory electrical connections between printed circuits and detachable electrical components such as electronic tubes with which the printed circuit assembly is designed to operate.

Usually, where the circuitry involves printed circuits, the tubes and circuit components are connected by mounting the electronic tube in a conventional tube socket and then making soldered connections between the printed circuit and the proper socket terminals. However, these socket terminals with their soldered connections are cumbersome and largely nullify the compact features of a printed circuit.

In addition, a difficulty arises in attempting to make a soldered connection between a socket terminal and a portion of a printed circuit. Electronic tubes have heretofore usually been mounted perpendicular to the plane of a sheet or sub-chassis upon which the printed circuit is placed, for the reason that the tube socket is usually mounted in an aperture punched in the sheet or sub-chassis. Consequently, connections between the socket terminals and the printed circuit consist either of edge contacts or spot soldered contacts of small area. Such contacts are often inadequate and result in open or intermittent connections. Also, the use of conventional tube sockets of the subminiature tube size requires that the various electrical connections to the tube contacts be very closely spaced. Such spacing increases the possibility of short circuits, with the danger increasing as the diameter of the tube diminishes.

It is accordingly an object of the present invention to provide an assembly for connecting electronic tubes to circuits which eliminates the use of a conventional tube socket.

Another object of the invention is to provide an assembly for circuit conductors and components having improved means for making solderless connections between the printed conductors and the leads or prongs of detachable electrical units.

A still further object of the invention is to provide a novel mounting assembly for electronic tubes which may be easily and cheaply manufactured.

For a better understanding of the invention together with other and further objects thereof, reference is made to the following detailed description, taken in connection with the accompanying drawings, in which.

Figure 2:
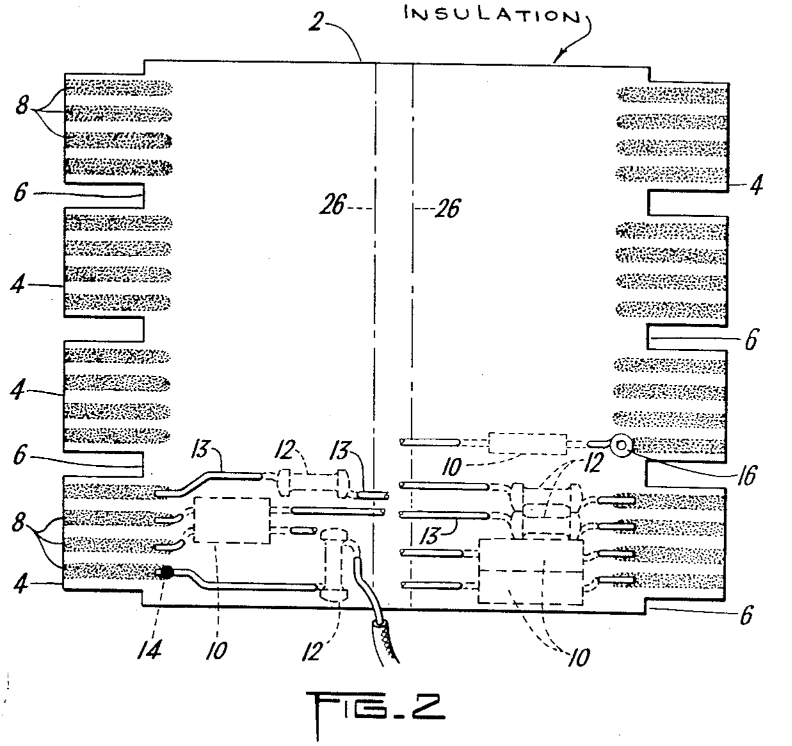
Fig. 2 shows a developed view of a flexible support sheet forming part of the assembly, with printed conductive portions and circuit components mounted thereon.

In accordance with my invention there is provided a flexible dielectric sheet 2, a plan view of which is shown in Fig. 2, which may be formed by conventional stamping and punching operations.

Extending laterally outward from opposite edges of the dielectric sheet are tabs or contact support fingers generally indicated as 4 which may be formed by stamping or cutting slots or recesses 6 along the edges of the sheet. The areas lying between adjacent slots comprise the contact support fingers 4 whose configuration is defined by the width and depth of the slots. Contact fingers 4 are shown for purposes of illustration as rectangular in shape, although they may be of other suitable configurations. Obviously, the number of contact support fingers may be more or less than the four pairs of fingers illustrated. The number of tabs or fingers on each sheet will depend chiefly on such factors as the number of external electrical units to be connected to any one assembly, the size of the components mounted on the sheet and the dimension of the external units.

Each support finger 4 has formed thereon a plurality of conductor strips or contacts 8. The conductor strips are adapted to make electrical contact with the lead wires of a subminiature electronic tube or other circuit element desired to be connected thereto. Impedance components 10, 12, which may comprise condensers and resistors, are mounted on the dielectric sheet 2 and an electrical connection is made between their leads and the proper printed conductor strips. These components may conveniently be secured to the insulated support sheet 2 by passing the leads 13 of the components, commonly known as pigtail leads, through suitably punched holes in the supporting sheet. Bending the leads after passage through the holes will serve to hold the components in their proper positions. If desired, the components may also be fastened by cementing them to the supporting sheet. Of course, any other suitable means for holding the components in place may be employed, as desired. For example, the pigtail leads may be fastened to the flexible sheet by means of rivets or eyelets or the body of the component may be secured to the sheet by stapling or other clamping means.

The pigtail lead of a component may be electrically connected to the printed conductor strips 8 by soldering, as indicated by reference numeral 14. Or the lead may be fastened, as shown in Fig. 2, by first wrapping it around an eyelet 16, passing the eyelet through the supporting sheet 2, and then crimping the eyelet at a point where it will make a secure electrical connection between the wrapped lead and a selected contact strip. Obviously, any other method that will provide a good electrical connection may be used.

Figure 3:
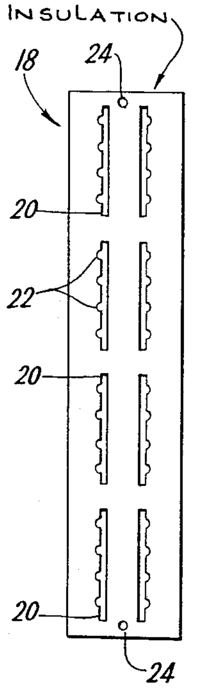
Fig. 3 is a top view of a retaining block used in the assembly.

In Fig. 3, a top view of a resilient insulating retaining member 18 is shown. This member, preferably a rectangular parallelepiped block, may be formed from any low loss, resilient insulating material such as rubber, neoprene, or the like. The length of the block will be determined primarily by the number of tubes or the like required to be mounted for use in a given application, and may be as long as desired.

Longitudinal slots 20 and semicircular channels 22 are cut completely through the retaining member 18. The slots 20 are adapted to receive contact support fingers 4 whereas the channels 22 which open at one side into the slots, are adapted to receive the leads or contact wires of detachable components such as subminiature electronic tubes. If desired, mounting holes 24 are provided near the ends of the retaining block through which mounting bolts are passed in order that the whole assembly may be fastened to a radio chassis or connected to other similar assemblies.

Figure 1:
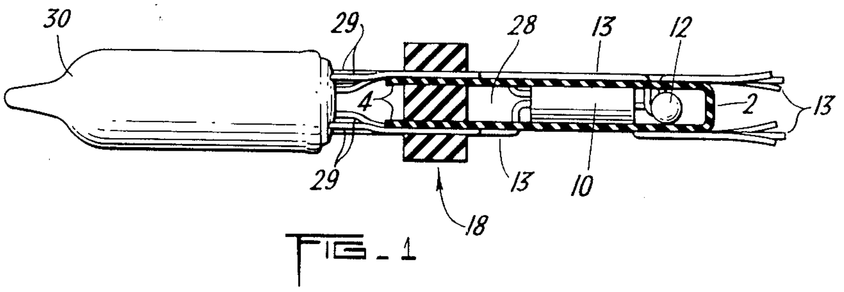
Fig. 1 is a partially cross-sectioned view of a mounting assembly embodying the present invention in a particular form.

The first step in assembling the units is to fold the flexible support sheet 2 along the fold lines 26. To facilitate the folding, creases along the lines 26 may be pressed into the dielectric sheet or the sheet otherwise weakened along these lines. These creases may be formed at the same time that the stamping operation for cutting the contact support fingers into the sheet is performed. By folding the sheet along the fold lines 26, and bending it back on itself, two supporting portions of substantially equal area are formed. These portions, taken in conjunction with the portions of the sheet lying between the two fold lines 26, define a boxlike enclosure 28 with open ends as illustrated in Fig. 1. The surfaces upon which the component parts are mounted are preferably turned inwardly so that in an assembled position these surfaces are adjacent to, and face each other. The circuit components are thereby securely held within the enclosure 28. The enclosure provides both a support for the components and complete protection from damage due to shock or rough handling. The width of the strip lying between the fold lines 26 will of course determine the spacing between the component support walls of the enclosure. The width may be of any dimension commensurate with the thickness and bulk of the component parts to be held within the enclosure.

Printed contact strips 8 are preferably placed on the reverse surface of the sheet from that on which the components are mounted, so that when the sheet is folded the support fingers or tabs 4 are held by the retaining member 18 in adjacent relationship with complementary support fingers extending from opposite edges of the dielectric sheet. The sets of contact strips 8 then will face outwardly.

After folding the dielectric support sheet 2, it may be maintained in its boxlike configuration by forcing the ends of the contact support tabs or fingers 4 through corresponding slots 20 in the retaining block 18. As the retaining block is resilient, the slots cut therein will deform sufficiently to allow easy insertion of the tabs. After insertion, the walls of the deformed slot will exert sufficient pressure to hold the tabs firmly in place. The tabs 4 are forced into the complementary slots 20 until the bottom portions of slots 6 about the under surface of retaining block 18. The length of the tab extending into the block will depend on the depth of slots 6, and it is preferable that these slots be dimensioned so as to allow the tabs 4 to completely fill deformable slots 20. In this manner the tabs will make a tight fit with the walls of slot 20 and a maximum length of the contact strips 8 will be presented to the leads of the detachable electrical device to be connected.

The member 18 essentially forms with the tab 4 and their contact strips 8 a plurality of multi-contact sockets having spaced contacts adapted to receive the leads 29 of an electronic tube 30 or the like, the leads being inserted through the channels 22 to be retained in electrical engagement with the contact strips. Each lead will be held in a secure electrical connection with its associated contact strip due to the pressure exerted upon the lead by the resilient walls of the channels 22. Additional external electrical circuits are completed to the unit by means of extending conductors 13.

While only a preferred embodiment of the invention has been described, it will be obvious to those skilled in the art that various changes and modifications may be made therein, without departing from the spirit of the invention as defined by the appended claims.

What I claim is:

1. An electronic tube mounting assembly comprising a folded dielectric sheet, said sheet having electrical components mounted thereon, a plurality of tab portions outwardly extending from the edges of said sheet, electrical strip contacts printed on said tab portions and connected to said components, a retaining block of resilient material, said retaining block having slots therein adapted to slidably receive and grip said tab portions, a plurality of channels in said block, said channels opening into said slots and adapted to receive the connecting leads of electrical units and hold said leads in electrical connection with said strip contacts.

2. An electrical component mounting assembly comprising a retaining block, a dielectric member with an electrical component mounted thereon, said dielectric member having at least one laterally extending tab portion with at least one conductive area thereon, an electrical connection between said conductive area and said electrical component, and said retaining block having a slot for the reception of each said tab portion, with at least so much of the material resilient as is immediately adjacent said slots to permit reception of an electrical conductor inserted through said slot and retained by said block in engagement with said conductive area.

3. A mounting assembly comprising a folded sheet of dielectric material having tabs on the two edges of the sheet opposite spaced fold lines therein, electrical components positioned to lie within the folded sheet, electrically conductive contact areas on said tab portions, some of the conductive leads of said components being electrically connected to said contact areas, and a resilient block of insulating material having slots therethrough to receive said tabs and having channels opening at one side into the slots to receive conductive leads of an electrical component to be plugged into the channels and to hold said last mentioned leads in good electrical contact with the contact areas on said tabs.

4. A device for mounting electrical components comprising a dielectric member with tab portions laterally extending from the opposite edges thereof adapted to be folded about a pair of fold lines, said tab portions having discrete conductive areas thereon, said fold lines in said dielectric member being substantially midway between the opposite edges so that the tab portions extend from opposite edges of said dielectric member and lie in adjacent relationship to each other when the member is folded, electrical components supported within the fold of said member and included in electrical circuits terminating in part on said discrete conductive areas, and a resilient member slotted to receive said tab portions and forming with said discrete conductive areas at least one multi-contact electrical socket having spaced contacts adapted to receive and retain electrical conductors inserted therein.

No references cited.